(12) United States Patent
Bok

(10) Patent No.: US 7,972,766 B2
(45) Date of Patent: Jul. 5, 2011

(54) METHOD FOR FORMING FINE PATTERN OF SEMICONDUCTOR DEVICE

(75) Inventor: Cheol Kyu Bok, Gyeonngi-Do (KR)

(73) Assignee: Hynix Semiconductor Inc., Icheon-si (KR)

( * ) Notice: Subject to any disclaimer, the term of this patent is extended or adjusted under 35 U.S.C. 154(b) by 724 days.

(21) Appl. No.: 11/962,405

(22) Filed: Dec. 21, 2007

(65) Prior Publication Data

US 2009/0004603 A1 Jan. 1, 2009

(30) Foreign Application Priority Data

Jun. 29, 2007 (KR) .................. 10-2007-0065078

(51) Int. Cl.
*G03F 7/26* (2006.01)
(52) U.S. Cl. ........................ 430/313; 430/394
(58) Field of Classification Search ............. 430/311, 430/313, 394
See application file for complete search history.

(56) References Cited

U.S. PATENT DOCUMENTS

| | | | |
|---|---|---|---|
| 5,750,680 A | 5/1998 | Kim et al. | |
| 6,051,678 A | 4/2000 | Kim et al. | |
| 6,132,926 A | 10/2000 | Jung et al. | |
| 6,143,463 A | 11/2000 | Jung et al. | |
| 6,150,069 A | 11/2000 | Jung et al. | |
| 6,180,316 B1 | 1/2001 | Kajita et al. | |
| 6,225,020 B1 | 5/2001 | Jung et al. | |
| 6,235,447 B1 | 5/2001 | Lee et al. | |
| 6,235,448 B1 | 5/2001 | Lee et al. | |
| 6,541,077 B1 | 4/2003 | Kozawa et al. | |
| 7,144,968 B2 | 12/2006 | Kozawa et al. | |
| 2008/0009138 A1* | 1/2008 | Lee | 438/703 |

FOREIGN PATENT DOCUMENTS

| | | |
|---|---|---|
| KR | 10-2005-0002384 A | 1/2005 |
| KR | 10-2007-0001510 | 1/2007 |
| KR | 10-2007-0044186 | 4/2007 |
| KR | 10-0714305 | 4/2007 |
| KR | 10-2008-0025818 | 3/2008 |

* cited by examiner

*Primary Examiner* — Kathleen Duda
(74) *Attorney, Agent, or Firm* — Marshall, Gerstein & Borun LLP

(57) ABSTRACT

A method for forming a fine pattern of a semiconductor device comprises: forming anti-reflection coating patterns over an underlying layer of a semiconductor substrate using an anti-reflection coating composition comprising a silicon-containing polymer; forming a photoresist pattern between the anti-reflection coating patterns using a photoresist composition comprising a silicon-containing polymer; and patterning the underlying layer using the photoresist patterns as an etching mask.

18 Claims, 6 Drawing Sheets

METHOD FOR FORMING FINE PATTERN OF SEMICONDUCTOR DEVICE

CROSS-REFERENCE TO RELATED APPLICATION

The priority of Korean patent application number 10-2007-0065078, filed on Jun. 29, 2007, the disclosure of which is incorporated by reference in its entirety, is claimed

BACKGROUND OF THE INVENTION

The invention relates to a method for forming a fine pattern of a semiconductor device using a double patterning method.

Due to rapid distribution of information media such as computers, semiconductor devices have been rapidly developed. The semiconductor devices should simultaneously be operated at high speed and have high storage capacity. As a result, process equipment and technology development have been required to manufacture a semiconductor device having improved integration, reliability, and an electronic characteristic of accessing data with a low manufacturing cost.

A lithography process required to improve the device integration includes an exposure technology using chemically amplified Deep Ultra Violet (DUV) light sources such as ArF (193 nm), VUV (157 nm) or EUV (13 nm), and a technology for developing photoresist materials suitable for the exposure light sources in order to form a pattern having a critical dimension (CD) of less than 0.7 μm.

As semiconductor devices are reduced in size, coating thicknesses of photoresist films are reduced to prevent collapse of a photoresist pattern in a lithography process. Further, multi-mask films having a larger etching selectivity ratio to a lower layer are introduced between an underlying layer and a photoresist film in order to secure an etching selectivity ratio to the patterned lower layer.

FIGS. 1*a* to 1*e* are cross-sectional diagrams illustrating a method for forming a fine pattern of a semiconductor device using a conventional double patterning method.

Referring to FIG. 1*a*, a multi-mask film is formed over an underlying layer 11 of a semiconductor device. The multi-mask films typically comprise a deposition film including an amorphous carbon layer 12, a silicon oxy-nitride film 13, and a polysilicon layer 14.

In order to remove a standing wave of a bottom of a photoresist film, a first bottom anti-reflective coating film 15 is formed over the polysilicon layer 14, and a first positive photoresist pattern 16 is formed over the coating film 15 by a lithography process.

Referring to FIG. 1*b*, the first bottom anti-reflection layer 15 and the polysilicon layer 14 are patterned with the first photoresist pattern 16 as an etching mask until the silicon oxy-nitride film 13 is exposed. As a result, a first lower anti-reflection coating film pattern 15-1 and a polysilicon pattern 14-1 are formed.

Referring to FIG. 1*c*, a second lower anti-reflection coating film 18 and a second photoresist film 19 are formed over the polysilicon pattern 14-1 and the exposed silicon oxy-nitride film 13 after a first lower anti-reflection coating film pattern 15-1 and the first photoresist pattern 16 are removed. An exposure process is performed with an exposure mask 20.

Referring to FIG. 1*d*, the resulting structure is developed to form a second photoresist pattern 19-1.

Referring to FIG. 1*e*, the second lower anti-reflection coating film 18 and the silicon oxy-nitride film 13 are patterned with the second photoresist pattern 19-1 and the polysilicon pattern 14-1 as an etching mask. As a result, three-layered deposition structures including the silicon oxy-nitride pattern 13-1, the second lower anti-reflection coating film pattern 18-1 and the second photoresist pattern 19-1 are formed between two-layered deposition structures including the polysilicon pattern 14-1 and the silicon oxy-nitride pattern 13-1.

The amorphous carbon layer 12 is etched with the two kinds of deposition structure such as two- and three-layered deposition structures as an etching mask until the underlying layer 11 is exposed.

However, since the conventional method includes forming a photoresist pattern and a lower anti-reflection coating film as an etching mask twice to form an amorphous carbon pattern, manufacturing process steps are actually extremely complicated, thereby increasing the process cost.

Moreover, as the two kinds of the etching mask in etching process to the amorphous carbon layer are used, it is difficult to obtain a uniform pattern profile after the etching process.

SUMMARY OF THE INVENTION

Various embodiments of the invention are directed at providing a method for forming a fine pattern of a semiconductor device which comprises forming anti-reflection coating patterns over an underlying layer using an anti-reflection coating composition comprising a silicon-containing polymer; forming a photoresist pattern between the anti-reflection coating patterns using a photoresist composition comprising a silicon-containing polymer; and patterning a subsequent underlying layer with the two kinds of patterns as an etching mask to simplify process steps using a double patterning method.

According to one embodiment of the invention, a method for forming a fine pattern of a semiconductor device comprises forming an amorphous carbon layer over an underlying layer of a semiconductor substrate. An anti-reflection coating film comprising a silicon-containing polymer is formed over the amorphous carbon layer. A first photoresist pattern is formed over the anti-reflection coating film. The anti-reflection coating film is etched with the first photoresist pattern as an etching mask to form an anti-reflection coating pattern until the amorphous carbon layer is selectively exposed. A second photoresist film comprising a silicon-containing polymer is coated over the anti-reflection coating pattern and the exposed amorphous carbon layer. The second photoresist film is etched to form the second photoresist pattern between the anti-reflection coating patterns.

The anti-reflection coating film preferably comprises a silicon-containing polymer where a silicon element is preferably present in an amount ranging from 30 wt % to 80 wt %, and highly preferably 15 wt % to 45 wt %, based on the total weight of the polymer; an organic solvent; and an additive such as a thermal acid generator and a photoacid generator. The silicon-containing polymer preferably comprises a compound including —Si—O— unit. Specifically, the silicon-containing polymer is preferably selected from the group consisting of siloxane compounds; silses-quioxane compounds including at least one of hydroxyl phenyl alkyl, alkyl and phenyl as a substituent, and combinations thereof. The organic solvent is preferably selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof. The organic solvent is preferably present in an amount ranging from about 500 parts by weight to 10,000 parts by weight of 100 parts by weight of the silicon-containing polymer. The additive is preferably present in an amount ranging from about 0.1 parts by weight to 10 parts by weight of 100 parts by weight of the silicon-containing polymer.

The first photoresist patterns are preferably formed by a lithography process, preferably using a general chemically amplified photoresist composition. The chemically amplified photoresist composition preferably includes a photoacid generator, an organic solvent, and a chemically amplified photoresist polymer as a base resin. The chemically amplified photoresist polymer is preferably selected from the group consisting of ROMA-type (ring-opened polymer of maleic anhydride unit) polymers including substituted maleic anhydride as a polymerization repeating unit; COMA-type (cycloolefin/maleic anhydride) polymers including cycloolefin, maleic anhydride, methacrylate, and acrylate as polymerization repeating units; and hybrid type polymers including combination thereof.

The process for forming the anti-reflection coating pattern is preferably performed by a etching process employing a source gas comprising $CF_4$, $CHF_3$, $O_2$ and Ar.

The method preferably further comprises removing the first photoresist pattern before coating the second photoresist film. The first photoresist film is preferably removed using a thinner to prevent loss of the lower amorphous carbon layer.

The exposing and developing process is preferably performed on the second photoresist film to form a second photoresist pattern between the anti-reflection coating patterns. The second photoresist film preferably has the same thickness (c) as the anti-reflection coating pattern thickness (a) or a greater thickness than that of the anti-reflection coating pattern. In addition, the second photoresist film (c) preferably has the same thickness as the first photoresist film (b) or a lower thickness than that of the first photoresist film ($a \leq c \leq b$).

The second photoresist film preferably comprises a silicon-containing polymer where a silicon element is present in an amount ranging from 30 wt % to 80 wt %, and highly preferably 15 to 45 wt %, based on the total weight of the polymer; an organic solvent; and a photoacid generator. The silicon-containing polymer preferably comprises a polymerization repeating unit of Formula 1.

[Formula 1]

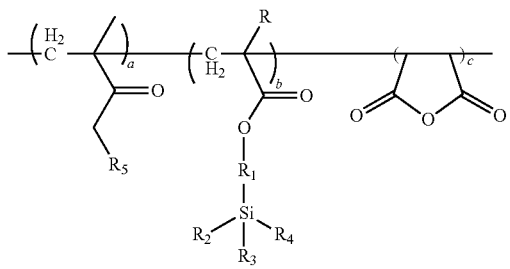

wherein R is hydrogen or methyl; $R_1$ is linear or branched $C_2$-$C_{10}$ alkylene; $R_2$, $R_3$ and $R_4$ are a $C_1$-$C_3$ alkoxy group; $R_5$ is OH, H, a $C_1$-$C_{10}$ alkyl or acid labile protecting group; and a relative ratio of the repeating unit number of a:b:c is 0.3~1: 1~3:1.

The organic solvent is preferably selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof. The organic solvent is preferably present in an amount ranging from about 500 parts by weight to 10,000 parts by weight of 100 parts by weight of the silicon-containing polymer. The photoacid generator is preferably present in an amount ranging from about 0.1 parts by weight to 10 parts by weight of 100 parts by weight of the silicon-containing polymer.

The method preferably further comprises patterning the subsequent amorphous carbon layer using the second photoresist pattern and the anti-reflection pattern as an etching mask. The subsequent patterning process is preferably performed with an etching process employing a source gas comprising $O_2$ and $N_2$ or $O_2$ and $H_2$.

The silicon element of the silicon-containing polymer, which is included in the second photoresist pattern and the anti-reflection coating pattern, is preferably reacted with the oxygen gas as an etching gas in the etching process, thereby cross-linking the polymers. As a result, the anti-reflection coating pattern and a photoresist pattern have the same etching selectivity as a conventional multi-mask film so that they can be used as a mask for polishing the amorphous carbon layer while the subsequent etching process is performed.

According to one embodiment of the present invention, the method can decrease the deposition process and the thickness of the multi-mask pattern, thereby reducing the number and complexity of process steps, and the manufacturing cost.

DETAILED DESCRIPTION OF A SPECIFIC EMBODIMENT

FIGS. 2a to 2e are cross-sectional diagrams illustrating a method for forming a fine pattern of a semiconductor device using a double patterning method according to an embodiment of the invention.

Figure 1A:
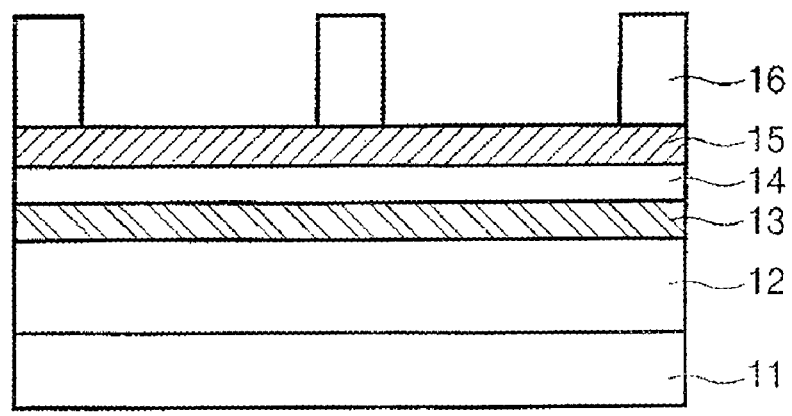
FIGS. 1a to 1e are cross-sectional diagrams illustrating a method for forming a fine pattern of a semiconductor device using a conventional double patterning method.
Figure 1B:
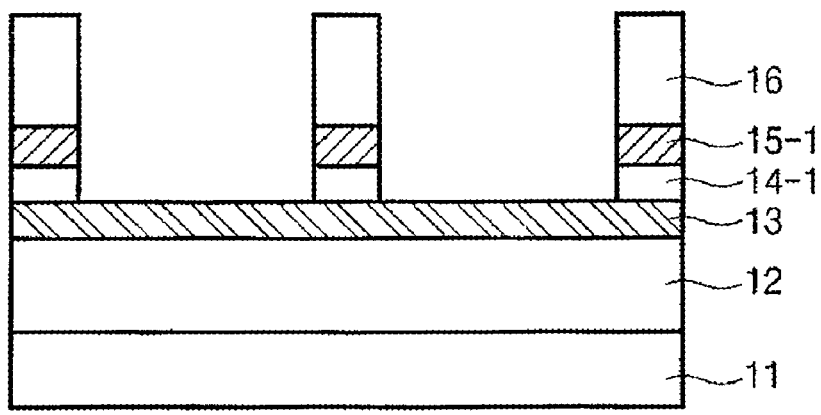
Figure 1C:
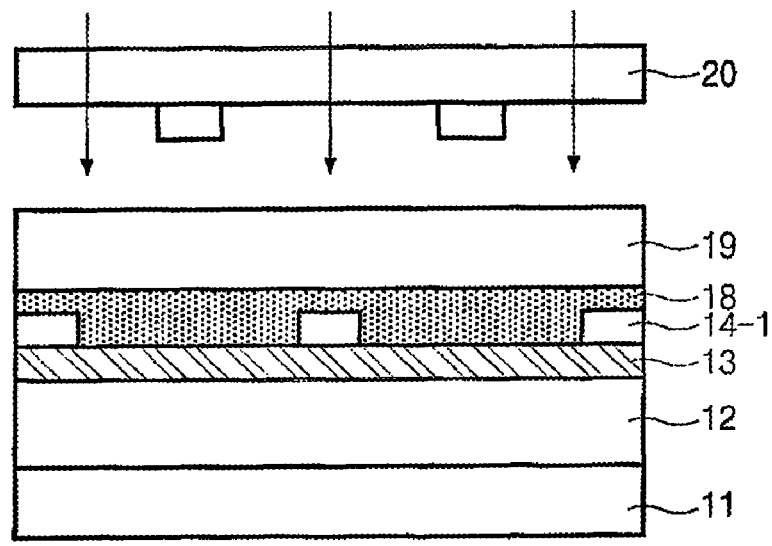
Figure 1D:
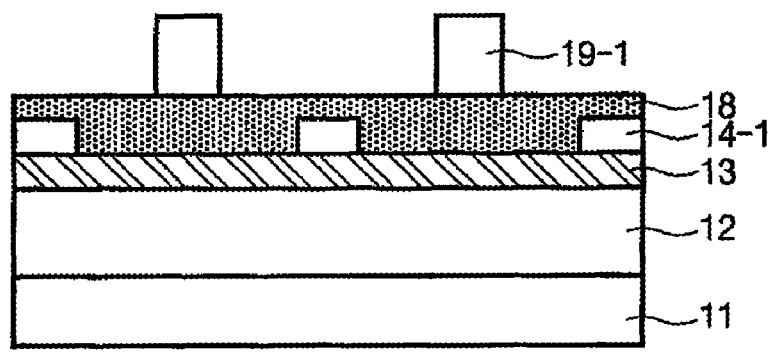
Figure 1E:
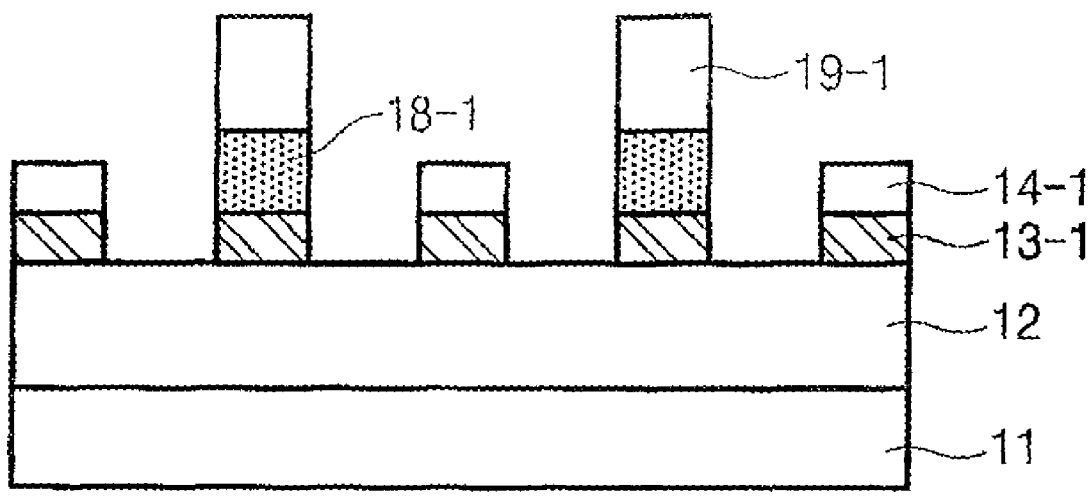
Figure 2A:
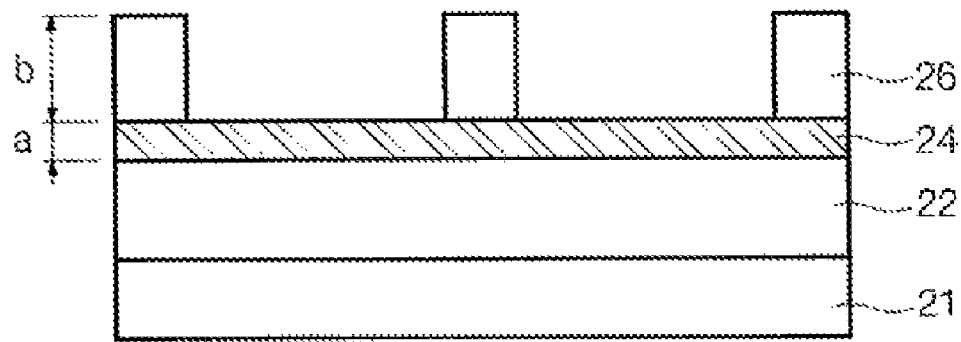
FIGS. 2a to 2e are cross-sectional diagrams illustrating a method for forming a fine pattern of a semiconductor device using a double patterning method according to an embodiment of the invention.

Referring to FIG. 2a, an amorphous carbon layer 22 is formed over an underlying layer 21 of a semiconductor device to have a thickness preferably in a range from about 1,000 Å to about 2,000 Å, highly preferably 1,500 Å.

Any suitable underlying layer can be used. Specifically, the underlying layer preferably may comprise a silicon nitride (SiN) film, a silicon oxide ($SiO_2$) film, a polysilicon layer, or a metal layer. Preferably, the underlying layer is a gate electrode formed by depositing a gate oxide film/poly layer/tungsten layer/mask nitride film.

An anti-reflection coating composition comprising a silicon-containing polymer is coated over the amorphous carbon layer 22. The resulting structure is baked, preferably at about 200~250° for about 90 seconds to form an anti-reflection coating film 24. The anti-reflection coating film 24 has a thickness (a) in a range from about 500 Å to about 1,000 Å.

The anti-reflection coating film preferably comprises a silicon-containing polymer where a silicon element is present in an amount ranging from 30 wt % to 80 wt %, highly preferably 15 wt % to 45 wt %, based on the total weight of the polymer; an organic solvent; and an additive such as a thermal acid generator and a photoacid generator. The silicon-containing polymer preferably comprises a compound including —Si—O— unit. Specifically, the silicon-containing polymer is preferably selected from the group consisting of siloxane compounds, silses-quioxane compounds including hydroxyl phenyl alkyl, an alkyl or phenyl as a substituent, and combinations thereof. In the disclosed embodiment, NCH0987N (produced by Nissan Chemical Co.), HM21 (produced by TOK Co.) and ODL series (produced by Shinetsu Co.) are illustratively used.

The organic solvent is preferably selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof. The organic solvent is preferably present in an amount ranging from about 500 parts by weight to 10,000 parts by weight of 100 parts by weight of the silicon-containing polymer. The additive is preferably present in an amount ranging from about 0.1 parts by weight to 10 parts by weight of 100 parts by weight of the silicon-containing polymer.

A first photoresist pattern 26 is formed on the anti-reflection coating film 24, preferably by a lithography process.

Any suitable type of first photoresist pattern can be used, and is preferably formed by lithography process using a general chemically-amplified photoresist composition. Suitable chemically-amplified photoresist compositions are disclosed in U.S. Pat. No. 5,750,680 (May 12, 1998), U.S. Pat. No. 6,051,678 (Apr. 18, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001), the respective disclosures of which are incorporated by reference herein. Specifically, the chemically-amplified photoresist composition preferably comprises a photoacid generator, an organic solvent, and a chemically-amplified photoresist polymer, preferably comprising a polymer selected from the group consisting of ROMA-type polymers comprising substituted maleic anhydride as a polymerization repeating unit; COMA-type polymers comprising cycloolefin, maleic anhydride, methacrylate and acrylate as polymerization repeating units, and hybrid type polymers comprising combinations thereof as a base resin. The first photoresist pattern 26 has a thickness (b) in a range from about 1,200 Å to about 3,000 Å.

In the disclosed embodiment, AIM5076 (produced by Japan Synthetic Rubber (JSR) Co.) is coated over the anti-reflection coating film 24, and exposed and developed to form the first photoresist pattern 26 at 1,500 Å. The exposure process is illustratively performed with a 1700i ArF immersion scanner (produced by ASML Holding Co.). The exposure process is preferably performed with KrF or EUV as well as ArF as exposure light sources.

Figure 2B:
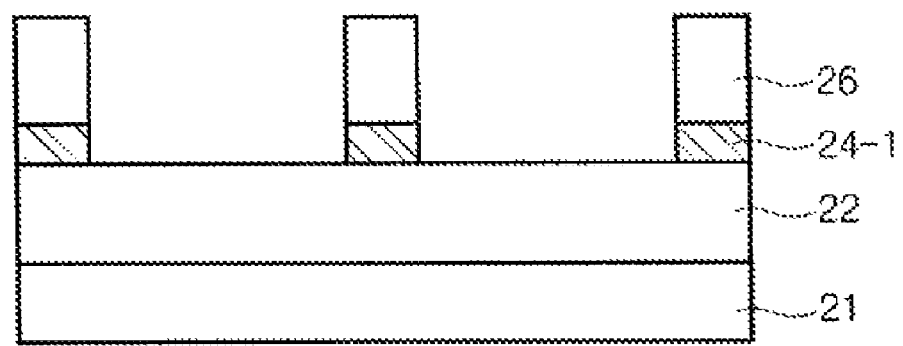

Referring to FIG. 2b, the anti-reflection coating film 24 is patterned with the first photoresist pattern 26 as an etching mask to expose the amorphous carbon layer 22. As a result the anti-reflection coating pattern 24-1 is formed.

The patterning process is preferably performed with a mixture gas including $CF_4$ (90 sccm), $CHF_3$ (30 sccm), $O_2$ (11 sccm), and Ar (600 sccm) under a pressure (160 mT) and a power (150 W) in a FLEX etching chamber (produced by Lam Co.).

The first photoresist pattern 26 is removed, preferably with a thinner to prevent loss of the lower amorphous carbon layer. When the first photoresist film is removed by an ashing process, the surface of the lower amorphous carbon layer may be damaged.

Figure 2C:
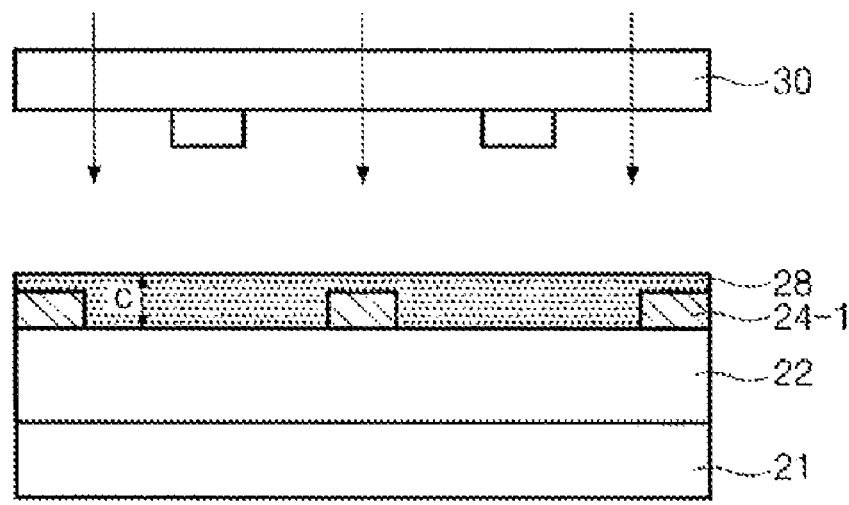

Referring to FIG. 2c, a second photoresist composition is coated over the exposed amorphous carbon layer 22 and the anti-reflection coating pattern 24-1. The resulting structure is baked, preferably at about 120° C. to about 180° C. for about 90 seconds to form a second photoresist film 28. The second photoresist film 28 has a thickness (c) in a range from about 500 Å to about 1,500 Å, highly preferably 1,000 Å.

The second photoresist film (c) preferably has the same thickness as the anti-reflection coating pattern (a) or a greater thickness than that of the anti-reflection coating pattern. In addition, the second photoresist film (c) preferably has the same thickness as the first photoresist film (b) or a lower thickness than that of the first photoresist film (a≦c≦b).

The second photoresist composition preferably comprises a silicon-containing polymer where a silicon element is present in an amount ranging from 30 wt % to 80 wt %, highly preferably 15 wt % to 45 wt %, based on the total weight of the polymer, a photoacid generator, and an organic solvent. Any suitable silicon-containing polymer can be used. For example, silicon-containing polymers disclosed in Korean Patent Publication No. 10-2005-002384, U.S. Pat. Nos. 6,541,077 (Apr. 1, 2003) and 7,144,968 (Dec. 5, 2006), the respective disclosures of which are incorporated by reference herein, may be used. Preferably, the silicon-containing polymer includes a polymerization repeating unit of Formula 1. In the embodiment, SHB-A629 (produced by Shinetsu Co.) or SAX-100K (produced by JSR Co.) is used.

[Formula 1]

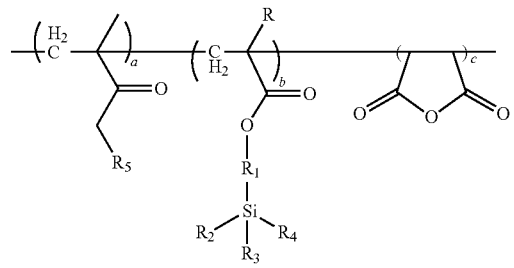

wherein R is hydrogen or methyl; $R_1$ is linear or branched $C_2$-$C_{10}$ alkylene; $R_2$, $R_3$ and $R_4$ are a $C_1$-$C_3$ alkoxy group; $R_5$ is OH, H, a $C_1$-$C_{10}$ alkyl or acid labile protecting group; and a relative ratio (mol) of the repeating unit number of a:b:c is 0.3~1:1~3:1. The organic solvent is preferably selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof. The organic solvent is preferably present in an amount ranging from about 500 parts by weight to 10,000 parts by weight of 100 parts by weight of the silicon-containing polymer. The photoacid generator is preferably present in an amount ranging from about 0.1 parts by weight to 10 parts by weight of 100 parts by weight of the silicon-containing polymer.

Figure 2D:
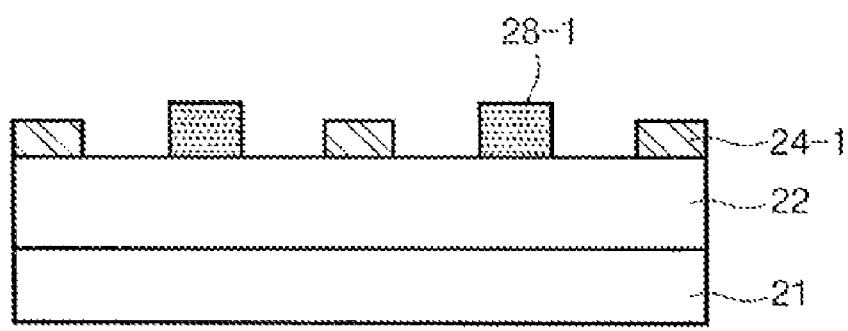

The second photoresist film 28 is exposed with an exposure mask 30 and developed to form a second photoresist pattern 28-1 between the anti-reflection coating patterns 24-1 as shown FIG. 2d.

The exposure process is preferably performed with a 1700i ArF immersion scanner (produced by ASML Holding Co.). The exposure process can be performed with KrF or EUV, for example, as well as with ArF. The developing process is preferably performed with 2.38 wt % tetramethyl ammonium hydroxide (TMAH) aqueous solution.

The anti-reflection coating pattern 24-1 including the silicon-containing polymer is not exposed in the exposing process to form the second photoresist pattern 28-1, but remains as an initial pattern shape after the developing process.

Figure 2E:
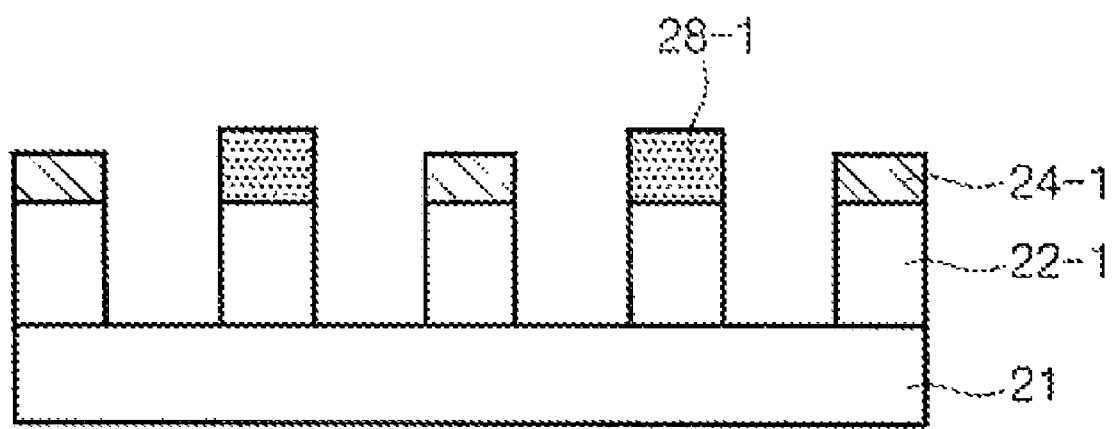

Referring to FIG. 2e, the amorphous carbon layer 22 is patterned with the second photoresist pattern 28-1 and the anti-reflection pattern 24-1 as an etching mask to form the amorphous carbon layer pattern 22-1.

The patterning process is preferably performed in a FLEX etching chamber (produced by Lam Co.) under a pressure (160 mT) and a power (150 W) with a plasma etching gas having a flow ratio of $O_2:N_2=1:1\sim3:2$ or of $O_2:H_2=5:2$.

The silicon element of the silicon-containing polymer which is included in the second photoresist pattern and the anti-reflection coating pattern is reacted with the oxygen gas as an etching gas in the etching process, thereby cross-linking the polymers. As a result, the second photoresist pattern and the anti-reflection coating pattern have an etching selectivity so that they can be used as a mask for polishing an underlying layer while the etching process is performed.

As described above, according to the disclosed embodiment of the invention, a method for forming a fine pattern of a semiconductor device includes forming the anti-reflection coating pattern 24-1 and the second photoresist pattern 28-1 comprising a silicon-containing polymer instead of forming a multi mask film over an underlying layer. The anti-reflection coating pattern and a photoresist pattern have the same etching selectivity ratio as a conventional multi mask film. Therefore, the method simplifies the process steps and reduces the manufacturing cost.

Moreover, the two kinds of the pattern that have a similar structure can be used as a pattern for transcribing a circuit image in a lithography process to obtain a uniform pattern profile. Also, the invention provides a semiconductor device fabricated by the method for forming a fine pattern of a semiconductor device.

The described embodiments of the invention are illustrative and not limiting. Various alternatives and equivalents are possible. The invention is not limited by the lithography steps described herein, nor is the invention limited to any specific type of semiconductor device. For example, the invention may be implemented in a dynamic random access memory (DRAM) device or non-volatile memory device. Other additions, subtractions, or modifications are intended to fall within the scope of the appended claims.

What is claimed is:

1. A method for forming a fine pattern of a semiconductor device, the method comprising:
    forming an amorphous carbon layer over an underlying layer of a semiconductor substrate;
    forming an anti-reflection coating film comprising a silicon-containing polymer over the amorphous carbon layer;
    forming a first photoresist pattern on the anti-reflection coating film;
    patterning the anti-reflection coating film using the first photoresist pattern as an etching mask to selectively expose the amorphous carbon layer and form anti-reflection coating patterns;
    forming a second photoresist film comprising a silicon-containing polymer over the anti-reflection coating patterns and the exposed the amorphous carbon layer; and
    patterning the second photoresist film to form a second photoresist pattern between the anti-reflection coating patterns.

2. The method according to claim 1, wherein the anti-reflection coating film comprises a silicon-containing polymer where a silicon element is present in an amount ranging from 30 wt % to 80 wt % based on the total weight of the polymer; an organic solvent; and an additive selected from the group consisting of a thermal acid generator and a photoacid generator.

3. The method according to claim 2, wherein the silicon-containing polymer is selected from the group consisting of siloxane compounds, silsesquioxane compounds comprising at least one of hydroxyl phenyl alkyl, alkyl, and phenyl as a substituent, and combinations thereof.

4. The method according to claim 2, wherein the organic solvent is selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof.

5. The method according to claim 2, wherein the organic solvent is present in an amount ranging from 500 to 10,000 parts by weight, based on 100 parts by weight of the silicon-containing polymer; and
    the additive is present in an amount ranging from 0.1 to 10 parts by weight, based on 100 parts by weight, of the silicon-containing polymer.

6. The method according to claim 1, wherein the first photoresist patterns are formed with a chemically-amplified photoresist composition.

7. The method according to claim 6, wherein the chemically-amplified photoresist composition comprises a photoacid generator, an organic solvent, and a chemically-amplified photoresist polymer as a base resin.

8. The method according to claim 7, wherein the chemically-amplified photoresist polymer is selected from the group consisting of ROMA-type polymers comprising substituted maleic anhydride as a polymerization repeating unit, COMA-type polymers comprising cycloolefin, maleic anhydride, methacrylate, and acrylate as polymerization repeating units, and hybrid type polymer comprising combinations thereof.

9. The method according to claim 1, comprising patterning the anti-reflection coating film by a dry etching process employing a source gas, the source gas comprising $CF_4$, $CHF_3$, $O_2$ and Ar.

10. The method according to claim 1, further comprising removing the first photoresist pattern before coating the second photoresist film.

11. The method according to claim 10, comprising removing the first photoresist pattern by using a thinner.

12. The method according to claim 1, wherein the second photoresist film has the thickness as same as or greater than the anti-reflection coating pattern; and
    the second photoresist film has a thickness as same as or less than the first photoresist film.

13. The method according to claim 1, wherein the second photoresist film comprises a silicon-containing polymer where a silicon element is present in an amount ranging from 30 wt % to 80 wt % based on the total weight of the polymer, an organic solvent, and a photoacid generator.

14. The method according to claim 13, wherein the silicon-containing polymer comprises a polymerization repeating unit of Formula 1:

[Formula 1]

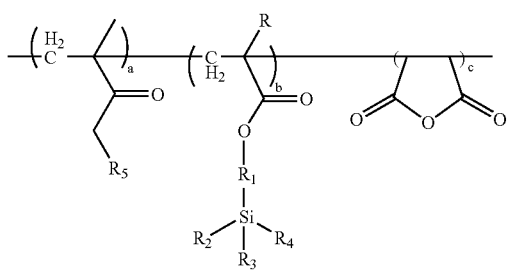

wherein R is hydrogen or methyl; $R_1$ is linear or branched $C_2$-$C_{10}$ alkylene; $R_2$, $R_3$ and $R_4$ are a $C_1$-$C_3$ alkoxy group; $R_5$ is selected from the group consisting of OH, H, a $C_1$-$C_{10}$ alkyl and acid labile protecting group; and a relative ratio of the repeating unit number of a b:c is 0.3~1:1~3:1.

15. The method according to claim 13, wherein the organic solvent is selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof.

16. The method according to claim 13, wherein the organic solvent is present in an amount ranging from 500 to 10,000 parts by weight, based on 100 parts by weight of the silicon-containing polymer, and
the photoacid generator is present in an amount ranging from 0.1 to 10 parts by weight, based on 100 parts by weight of the silicon-containing polymer.

17. The method according to claim 1, further comprising patterning the amorphous carbon layer using the second photoresist pattern and the anti-reflection pattern as an etching mask after forming the second photoresist pattern.

18. The method according to claim 17, comprising performing the patterning process with an etching process employing a source gas comprising $O_2$ and $N_2$, or $O_2$ and $H_2$.

* * * * *